United States Patent
Lin

(10) Patent No.: US 6,655,448 B1
(45) Date of Patent: Dec. 2, 2003

(54) RADIATOR WITH HEAT DISSIPATION PIECES CONNECTED IN SERIES

(76) Inventor: Hai-Ching Lin, No. 9-1, Wa Yao Keng, Shoei Yuan Li, Dann Shoei Cheng, Taipei (TW)

(*) Notice: Subject to any disclaimer, the term of this patent is extended or adjusted under 35 U.S.C. 154(b) by 0 days.

(21) Appl. No.: 10/145,704

(22) Filed: May 16, 2002

(51) Int. Cl.⁷ .................................................. H05K 7/20
(52) U.S. Cl. ....................... 165/80.3; 165/185; 361/704
(58) Field of Search ................................ 165/80.3, 185; 361/704, 710; 174/16.3; 257/719, 722

(56) References Cited

U.S. PATENT DOCUMENTS

| | | | |
|---|---|---|---|
| 5,509,465 A | * 4/1996 | Lai | 165/80.3 |
| 5,947,192 A | * 9/1999 | Kuo | 165/80.3 |
| 6,269,003 B1 | * 7/2001 | Wen-Chen | 361/704 |
| 6,289,975 B2 | * 9/2001 | Kuo | 165/80.3 |
| 6,382,307 B1 | * 5/2002 | Wang et al. | 165/80.3 |
| 6,401,810 B1 | * 6/2002 | Kuo et al. | 165/185 |

* cited by examiner

Primary Examiner—Allen Flanigan
(74) Attorney, Agent, or Firm—Bacon & Thomas, PLLC

(57) ABSTRACT

A radiator. The radiator includes heat dissipating pieces secured together in series by a connection device. Each of the heat dissipating pieces includes upper and lower bending edges, and at least one opening. An insert is inserted into the openings of the heat dissipating pieces positioned in a series and secured therein.

1 Claim, 3 Drawing Sheets

RADIATOR WITH HEAT DISSIPATION PIECES CONNECTED IN SERIES

BACKGROUND OF THE INVENTION

1. Field of the Invention

The present invention relates to a radiator comprising a plurality of dissipation pieces provided with bending edges, which are connected in series.

2. Description of the Prior Art

The prior art radiator (shown as FIG. 1) is part of the electronic equipment, in conjunction with a fan (not shown) configured to discharge heated air in closed spaces of electronic devices to avoid high temperature induced equipment failure. Generally, the radiator utilizes laminated structures formed from the metals with good heat conductivity, such as copper, aluminum, etc. to absorb heat energy, and discharges the heated air through the fan or heat interchange with air. On a common radiator 1, the dissipation pieces 10 for heat dissipation are usually a combination of laterally arranged pieces (shown as FIG. 1, FIG. 2). During the manufacturing process, these dissipation pieces 10 should be provided with joint holes 11 that are bent at two sides and combined through the joint holes 11, the procedure of which is complicated. In addition, the thickness of each lamination is extremely thin and is extremely delicate during manufacture, thus the manufacturing cost is increased and the yield is not high. The conventional radiator 10 includes another disadvantage in that due to the formation of the joint holes 11, it is necessary to form a gap of a trough 12 to serve as the joint space for jointing with the protrusion joint 13, which results in that the smallest thickness for the bending edge 14 of the radiator 10 must be greater than the thickness of the trough 12, such that even the radiator 10 can be combined with connected dissipation pieces, but the distance between pieces is still configured to be greater than or equal to the thickness of the bending edge 14. The shape of the radiator 10 structure greatly influences the manufacture of the radiator 10 due to the sizes of the devices in the electronic equipment that are often confined, and the radiator itself is not an exception, and the dissipation effect of the radiator depends on the number of the dissipation pieces. If the dissipation pieces 10 must be formed with the distance of the dissipation pieces being comparable with the bending edge 14, in principle, it is hard to achieve the enhancement of dissipation efficiency by increasing the number of dissipation pieces in a limited space.

SUMMARY OF THE INVENTION

The present invention provides a radiator structure capable of adding more dissipation pieces than a conventional radiator, and the dissipation efficiency of the radiator can be enhanced via integral combination of more dissipation pieces. The radiator of the present invention includes a plurality of dissipation pieces combined mutually in series via a connection device such as an insert or bolt, etc., wherein two opposite edges of the dissipation pieces are bent inwardly to form bending edges, wherein a bending edge is formed on two ends of the edge and the middle section therebetween is an unbent edge. Since there are no joint structures employed on the bending edge, the bent thickness of the bending edge can be minimized, thus the distance between various dissipation pieces after being combined in series can be reduced. Consequently, more dissipation pieces can be packed in the limited space of the radiator, and the dissipation efficiency of the radiator can be improved via the increase in the number of the dissipation pieces. The joints between the dissipation pieces of the present invention utilize a connection device capable of connecting all of the dissipation pieces in series. The connection device may be one kind of insert, bolt or shaft, etc., and to achieve the connection, the surface of the dissipation pieces may be provided with means such as apertures or grooves, etc., and if the surface of the device for combining the dissipation pieces in series is smooth, it may be provided with a trench on the surface for enhancing the fixed combination of the dissipation pieces and the connection device. Further, the two opposite bending edge of the dissipation pieces may be of any shape capable of forming a minimum distance between the dissipation pieces.

DETAILED DESCRIPTION OF THE PREFERRED EMBODIMENT

Figure 1:
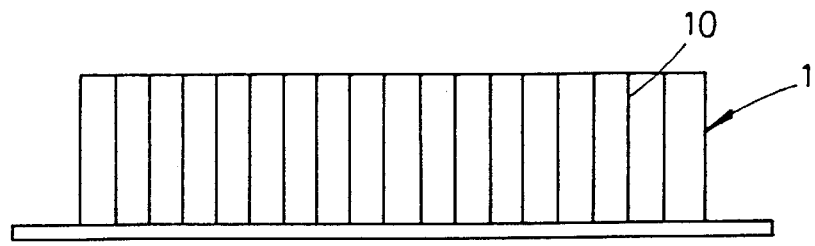
FIG. 1 is a front view showing a conventional radiator.
Figure 2:
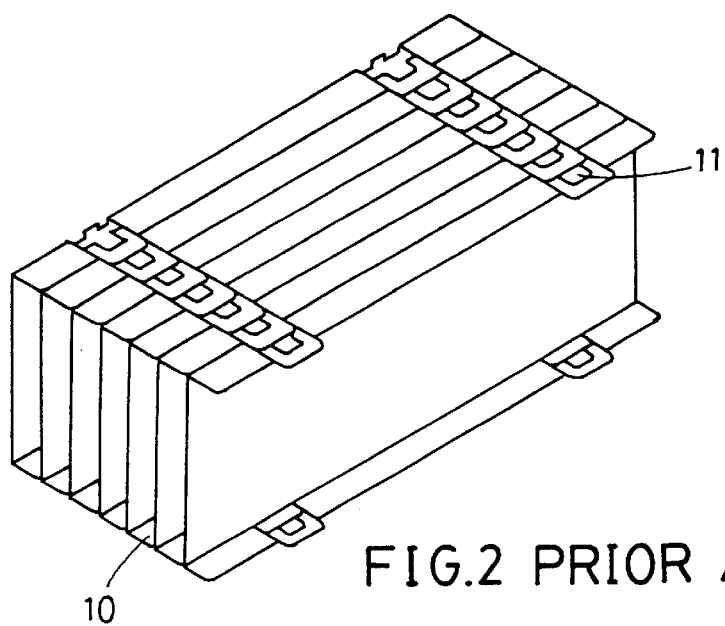
FIG. 2 is an elevational view showing the combination of the dissipation pieces of a conventional radiator.
Figure 3:
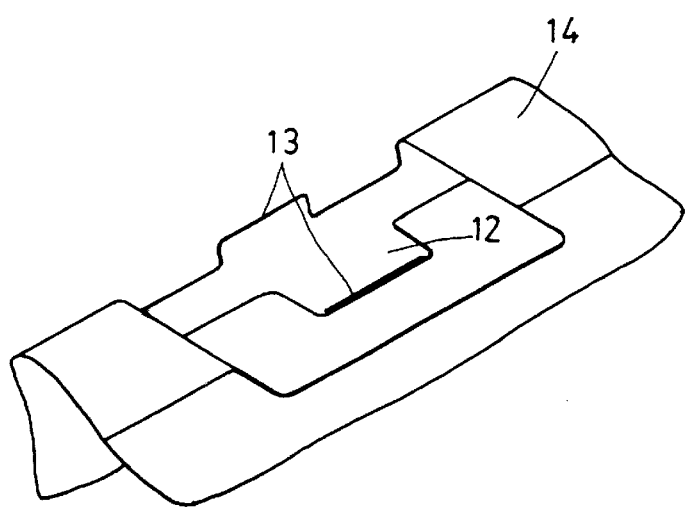
FIG. 3 is a detailed elevational view showing the joint structure of FIG. 2.
Figure 4:
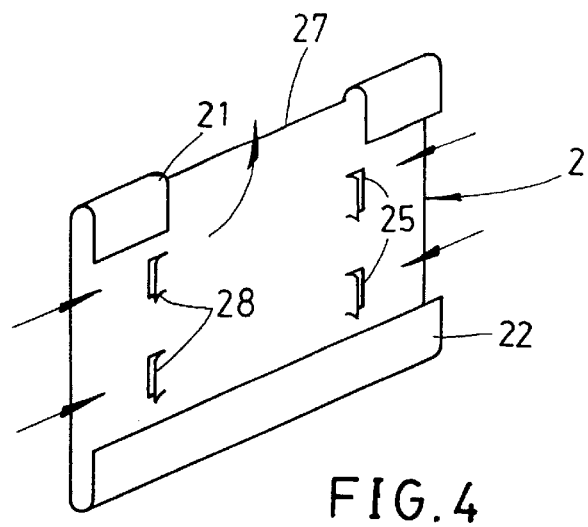
FIGS. 4–6 are elevational views showing the dissipation pieces of various embodiments of the present invention.
Figure 5:
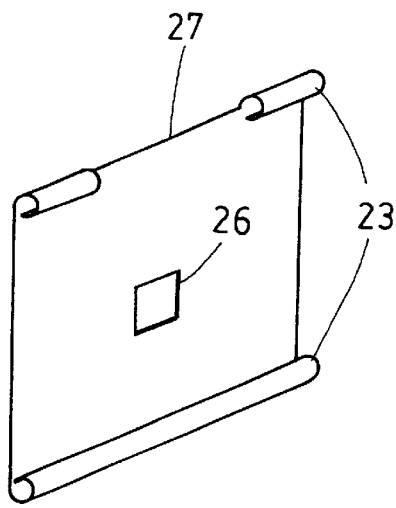
Figure 6:
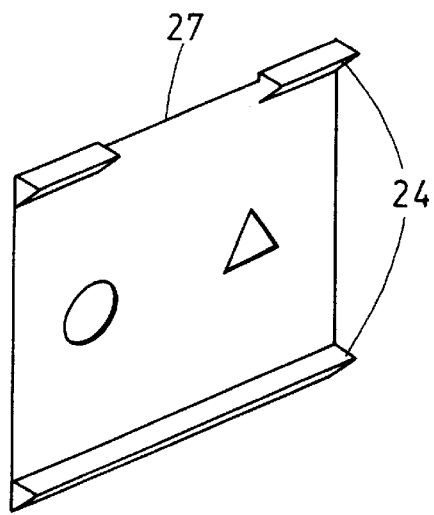

The preferred embodiment of the present invention includes a plurality of dissipation pieces connected mutually in series via a connection device such as an insert or bolt, wherein the dissipation pieces 2 each includes a piece body (shown as FIG. 4), the upper and lower edges thereof form opposing inwardly bending edges 21, 22, respectively, wherein the upper bending edge 21 is formed at two ends thereof, and the lower bending edge 22 is continuous. The bending edges 21, 22 can be provided on left and right edges of the dissipation piece 2. The form of the dissipation pieces can be varied, as shown in various shapes of the bending edges 23, 24, as shown in FIGS. 5 and 6, or other forms that are capable of forming a minimum width after bending. A hole is provided between the two opposite bending edges 21, 22 of each of the mentioned dissipation pieces 2 for insertion thereof an insert or bolt, etc., which may be an opening or groove 25, as shown in FIG. 4 or aperture 26, as shown in FIG. 5. If necessary, the number of holes provided on each of the dissipation pieces 2 may be increased, and the form or shape thereof may be reconfigured as shown in FIG. 6.

Figure 7:
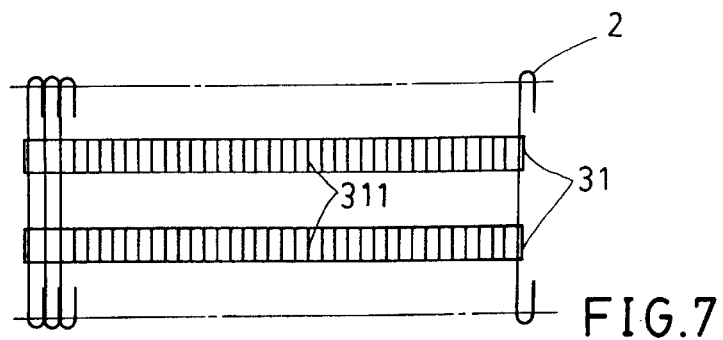
FIGS. 7 and 8 are top plan views showing various combination aspects of the present invention.
Figure 8:
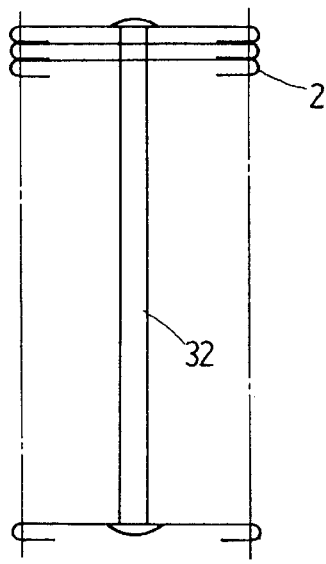
Figure 9:
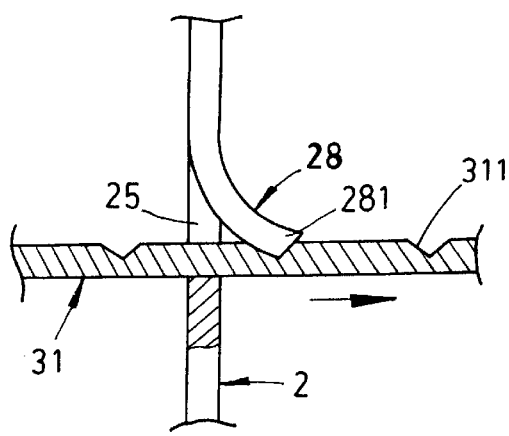
FIG. 9 is a structural view showing the combination of the dissipation pieces and the inserts of the present invention.

Referring to FIGS. 7 and 8, the present invention utilizes an insert 31 or bolt 32, etc. to connect adjacent dissipation pieces 2, and the ends thereof are mounted by bending or riveting or screwing to arrange the dissipation pieces 2 to be connected closely. The dissipation pieces 2 shown in FIG. 7 are laterally combined, while in the embodiment of FIG. 8, the dissipation pieces are vertically connected in series. Cold air from the side of the dissipation pieces 2 blows into the radiator via the means of a fan, etc. (not shown), and discharges the heat absorbed by the dissipation pieces 2 through the non-bending edge sections 27 between the two upper bending edges 21 (arrows in FIG. 4 show air flow directions). Thus, the flat edge section 27 of the dissipation piece 2 is the exhaust outlet of the radiator 4. If the combination of the dissipation pieces 2 of the present invention are connected by way of the inset 31, the surface of the insert 31 may be provided with ditches 311 (as shown in FIGS. 7 and 9). A major object of the ditch 311 is to fixedly combine the dissipation pieces 2 in the manner shown in FIG. 9, wherein the opening or groove 25 is provided on the dissipation piece 2, which is formed by outwardly bending a bending piece 28, while the insert 31 combines with the dissipation pieces 2 right in the direction of the arrow of FIG. 9, and the bending piece 28 can bounce on the surface of the insert 31 and will not confine the insert 31, and after combining the insert 31 and the dissipation pieces 2, the ends 281 of the bending pieces 28 will precisely wedge into respective pitches 311 of the insert 31, and this wedging prevents the dissipation pieces 2 from moving further in the direction of the arrow of FIG. 9 such that they cannot depart from the insert 31. Thus, the dissipation pieces 2 can be connected closely and fixedly via the insert 31. It will be appreciated that it is not necessary to provide ditch 311 on the surface of the insert 31, duet to the bending piece 28 of the dissipation pieces 2 that can only be bent out in a right direction, as shown in FIG. 9, if it is desired to make the dissipation pieces 2 move toward the right direction, i.e. depart from the insert 311, since the dissipation pieces 2 will be wedged more by the bending piece 28.

What is claimed is:

1. A radiator comprising:

a plurality of heat dissipating pieces secured together in series by a connection device, each of the heat dissipating pieces comprising upper and lower bending edges, each of the heat dissipating pieces including at least one groove, the groove formed by a bending piece having an end bent towards the plane of the bending edges of a respective one of the heat dissipating pieces; and the connection device comprising at least one insert having a series of spaced apart ditches and inserted through the grooves of adjacent ones of the heat dissipating pieces such that respective ones of the ends of the bending pieces are locked into corresponding ones of the ditches of the insert to secure the heat dissipating pieces in a series.

* * * * *